United States Patent
Moore et al.

(10) Patent No.: US 6,608,898 B1
(45) Date of Patent: Aug. 19, 2003

(54) BAND PASS AND NOTCH FILTERS FOR ECHO REDUCTION WITH LESS PHASE DISTORTION

(75) Inventors: Kendall G. Moore, Tempe, AZ (US); Samuel L. Thomasson, Gilbert, AZ (US)

(73) Assignee: Acoustic Technologies, Inc., Mesa, AZ (US)

( * ) Notice: Subject to any disclaimer, the term of this patent is extended or adjusted under 35 U.S.C. 154(b) by 0 days.

(21) Appl. No.: 09/413,677

(22) Filed: Oct. 6, 1999

(51) Int. Cl.[7] .................................. H04M 9/08
(52) U.S. Cl. ..................... 379/406.14; 379/338.07; 379/390.02; 381/83; 381/93; 327/556; 327/557
(58) Field of Search ................. 379/388.01, 388.05, 379/388.07, 390.01, 390.02, 390.04, 402, 406.01, 406.02, 406.07, 406.08, 406.14; 381/83, 92, 93, 95, 96, 99; 327/551, 552, 556, 557

(56) References Cited

U.S. PATENT DOCUMENTS

| | | | |
|---|---|---|---|
| 3,622,714 A | * 11/1971 | Berkley | ............ 379/392 |
| 4,543,665 A | * 9/1985 | Sotelo et al. | ............ 455/606 |
| 4,991,167 A | 2/1991 | Petri et al. | ............ 370/32.1 |
| 5,271,057 A | * 12/1993 | Addeo et al. | ............ 379/202 |
| 5,386,465 A | 1/1995 | Addeo et al. | ............ 379/202 |
| 5,434,912 A | * 7/1995 | Boyer et al. | ............ 379/202 |
| 5,473,295 A | * 12/1995 | Turunen | ............ 333/132 |
| 5,717,772 A | * 2/1998 | Lane et al. | ............ 381/93 |
| 6,294,956 B1 | * 9/2001 | Ghanadan et al. | ............ 330/124 |
| 6,404,278 B2 | * 6/2002 | Allen et al. | ............ 327/557 |

FOREIGN PATENT DOCUMENTS

WO    WO 01/26339 A1 * 4/2001 ............ H04M/1/00

OTHER PUBLICATIONS

"*Electronic Filter Design Handbook*" by Williams and Taylor, Third Edition, McGraw–Hill, Inc., 1995, p. 5.42–5.45, 6.30–6.35, 17.1–17.17.

* cited by examiner

Primary Examiner—Binh Tieu
(74) Attorney, Agent, or Firm—Paul F. Wille

(57) ABSTRACT

A complementary comb filter includes a plurality of band pass filters and a plurality of notch filters, wherein the notch filters have the same center frequencies as the band pass filters or the same center frequencies as the dead bands defined by the band pass filters. Phase distortion by the notch filters occurs primarily in the notch, thereby eliminating distortion of the signal.

14 Claims, 3 Drawing Sheets

BAND PASS AND NOTCH FILTERS FOR ECHO REDUCTION WITH LESS PHASE DISTORTION

BACKGROUND OF THE INVENTION

This invention relates to an audio processing circuit and, in particular, to an echo cancelling circuit employing band pass filters and notch filters having substantially the same center frequency.

There are two kinds of echo in a telephone system, an acoustic echo between an earphone or a speaker and a microphone and electrical echo generated in the switched network for routing a call between stations. In a handset, acoustic echo is typically not much of a problem. In speaker phones, where several people huddle around a microphone and loudspeaker, acoustic feedback is much more of a problem. Hybrid circuits (two-wire to four-wire transformers) located at terminal exchanges or in remote subscriber stages of a fixed network are the principal sources of electrical echo.

Many techniques have been developed to improve the clarity of the sound in a telephone. One such technique uses what is known as a comb filter; i.e. a plurality of filters wherein band pass filters alternate with band stop filters. Comb filters with complementary pass and stop bands are coupled in the two audio channels connecting the two stations of a telephone call. That is, the pass bands in one channel are the stop bands in the other channel. As a result, a signal traveling in one direction will be slightly attenuated but a signal traveling in a loop, i.e. an echo, will encounter both sets of stop bands and be highly attenuated.

The use of the complementary comb filters reduces the acoustic coupling between the speaker and microphone at each station as well as inter-station echo. Echo canceling circuits, which try to recognize a delayed signal as an echo, are much more complicated than complementary comb filter circuits and the two are often used together to eliminate echoes and other noises.

Complementary comb filter circuits are disclosed in U.S. Pat. No. 5,386,465 (Addeo et al.). This patent includes complementary comb filters in combination with other apparatus for processing audio signals to reduce noise. U.S. Pat. No. 4,991,167 (Petri et al.) discloses a slightly different system. Signals in the sending and receiving directions are each separated into a set of bands, each including an attenuator. The signal in a band in one direction of transmission is controlled as a function of the amplitude of the signal in the same band in the other direction of transmission.

A problem with this approach is that, unlike the complementary comb filters, one can attenuate the signals in adjacent bands, thereby noticeably degrading the quality of the voice transmission. In the extreme, the telephone is reduced to "half duplex" or simplex operation, i.e. single direction at a time because sounds from the other station are inaudible. The speaker at one station must stop and the circuits must re-settle before the person at the other station can be heard.

Another problem with complementary comb filters is the phase distortion introduced by each filter. Each band pass filter has a phase shift associated with it and even the desired signal passes through two such filters in the path from microphone to speaker, which affects the quality of the sound. Unwanted signals, such as echoes, travel through at least two more filters. The total phase shift introduced by the four filters can be enough to allow the undesired signal to pass through the system rather than being fully attenuated.

In view of the foregoing, it is therefore an object of the invention to provide a noise reducing circuit that retains the advantages of a complementary comb filter with less signal degradation.

Another object of the invention is to provide an improved technique for reducing acoustic and electronic noise in an audio communication system.

A further object of the invention is to provide a complementary comb filter having minimal phase distortion.

SUMMARY OF THE INVENTION

The foregoing objects are achieved in this invention in which a complementary comb filter includes a plurality of band pass filters and a plurality of notch filters, wherein the notch filters have the same center frequencies as the band pass filters or the same center frequencies as the dead bands defined by the band pass filters.

BRIEF DESCRIPTION OF THE DRAWINGS

A more complete understanding of the invention can be obtained by considering the following detailed description in conjunction with the accompanying drawings, in which.

DETAILED DESCRIPTION OF THE INVENTION

Figure 1:
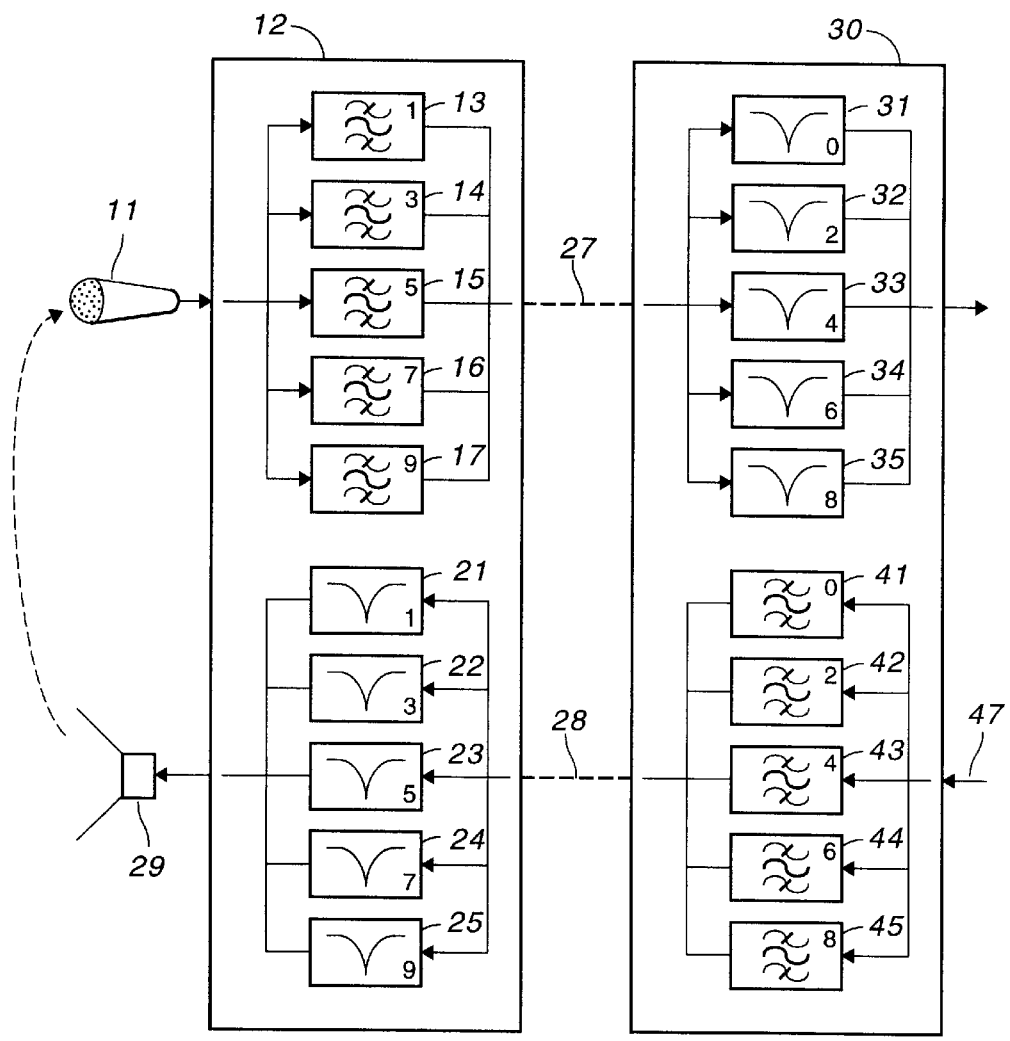
FIG. 1 illustrates an audio processing circuit constructed in accordance with a preferred embodiment of the invention.

In FIG. 1, sound incident upon microphone 11 is converted into an electrical signal and coupled to telephone 12. A portion of the circuitry within telephone 12 includes band pass filters 13, 14, 15, 16, and 17. The number of filters is a matter of design. Considering that the total bandwidth of the system is only 300–3,400 Hz, five filters are a nice compromise between precision and cost. Three band pass filters are the fewest usable.

In accordance with the invention, telephone 12 also includes notch filters 21, 22, 23, 24, and 25. The center frequencies of the notch filters corresponds to the center frequencies of the band pass filters. Thus, a signal passing through the band pass filters, traveling along transmission line 27 and reflected back to transmission line 28 would be attenuated by the notch filters. A single telephone constructed in accordance with the invention provides approximately 20 dB of attenuation of a signal between microphone 11 and speaker 29.

In accordance with the invention, telephone 30 is constructed in like manner except that the center frequencies of the filters are offset from the center frequencies of the filters in telephone 12. Specifically, the center frequencies of notch filters 31, 32, 33, 34, and 35 are between the center frequencies of the band pass filters in telephone 12. Thus, the notch filters in telephone 30 are aligned with the dead bands between the filters in telephone 12, which further increases the effectiveness of the circuit.

The center frequencies of the filters are preferably exponentially related. In a preferred embodiment of the invention, the center frequencies were determined from the following equation, $$f_k = 318 \times 1.3^k$$

where k=0–9, or from the following equations $$f_{odd} = 414 \times 1.3^{2k}$$

$$f_{even} = 318 \times 1.3^{2k}$$

where k=0–4. Other center frequencies or coefficients could be used instead.

Telephone 30 also includes band pass filters 41, 42, 43, 44, and 45 having the same center frequencies as the notch filters in telephone 30. Thus, a signal on input 47, e.g., from a microphone (not shown), is divided among the band pass filters, summed, and transmitted over line 28 to telephone 12. The center frequencies of the notch filters in telephone 12 correspond to the dead bands between the bands of band pass filters 41–45, enhancing the operation of these filters.

Figure 2:
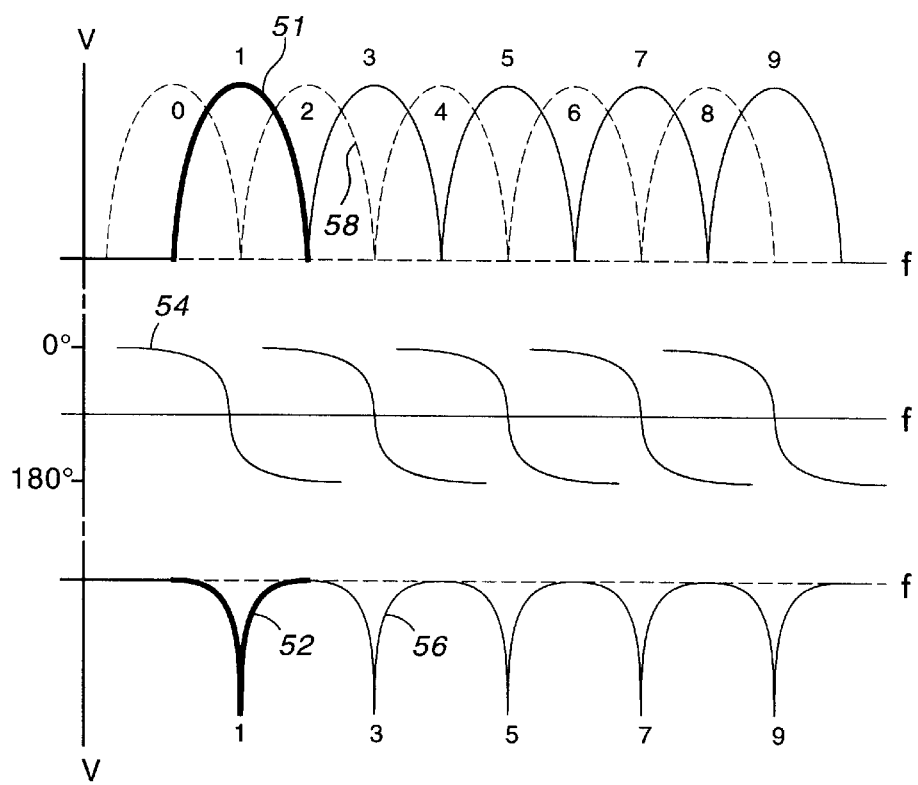
FIG. 2 is a chart illustrating the operation of the apparatus of FIG. 1.

The operation of telephones constructed in accordance with the invention is illustrated in FIG. 2. The center frequencies are numbered consistently with FIG. 1. In particular, curve 51 represents the frequency response of band pass filter 13 (FIG. 1) and curve 52 represents the frequency response of notch filter 21 (FIG. 1). Filters 13 and 21 have the same center frequency, thereby reducing the amount of echoes or other noises between microphone 11 and speaker 29.

Curve 54 represents the phase vs. frequency response of band pass filter 13 (FIG. 1). As can be seen, the phase changes most rapidly at the center frequency and the response curve is highly non-linear. This can lead to significant phase distortion, particularly if a signal is passed through several band pass filters.

The phase vs. frequency characteristic of notch filter 21 (FIG. 1) is similar except that the phase changes over a range of 90°–270°. The most rapid phase change also occurs at the center frequency but the center frequency is the point of greatest attenuation. Any signal passed by a notch filter has relatively little phase distortion. Thus, in accordance with the invention, phase distortion is significantly reduced by using notch filters in a complementary comb filter.

If one combines the frequency responses of notch filters 21 and 22 (FIG. 1), i.e. combines curves 52 and 56, the "center frequency" between the two notches is the same as the center frequency of band pass filter 42 (FIG. 1), represented by curve 58. Although the top of the response curve is slightly flatter and the sides are steeper, the two notch filters act as a band pass filter without the phase distortion.

Figure 3:
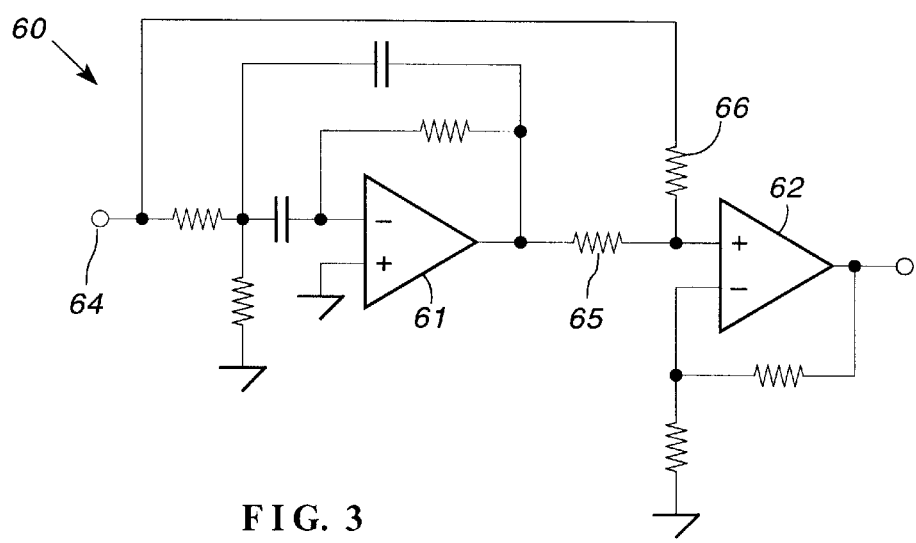
FIG. 3 is a schematic of a notch filter suitable for use in the invention.

Matching center frequencies can be tedious, time consuming, and costly. FIG. 3 illustrates a notch filter that greatly simplifies matching circuits and was used in one embodiment of the invention. In FIG. 3, notch filter 60 includes amplifier 61 configured as an inverting band pass filter and amplifier 62 as a summing amplifier. Amplifier 61, and the associated resistors and capacitors, provides a band pass function and the identical circuit, combined with amplifier 62, provides a notch filter of the same center frequency.

Amplifier 61 is known as a multiple feedback band pass circuit; see *"Electronic Filter Design Handbook"* by Williams and Taylor, Third Edition, McGraw-Hill, Inc., 1995, page 5.42–5.46. A signal on input 64 is filtered through amplifier 61 and coupled to the non-inverting input of amplifier 62. The input signal is also coupled directly to the same input of amplifier 62 by resistor 66. The filtered signal is inverted by amplifier 61 and subtracted from the direct signal at the input of amplifier 62 to produce the overall response of a notch filter; see pages 6.30–6.34 of the Williams and Taylor text.

Figure 4:
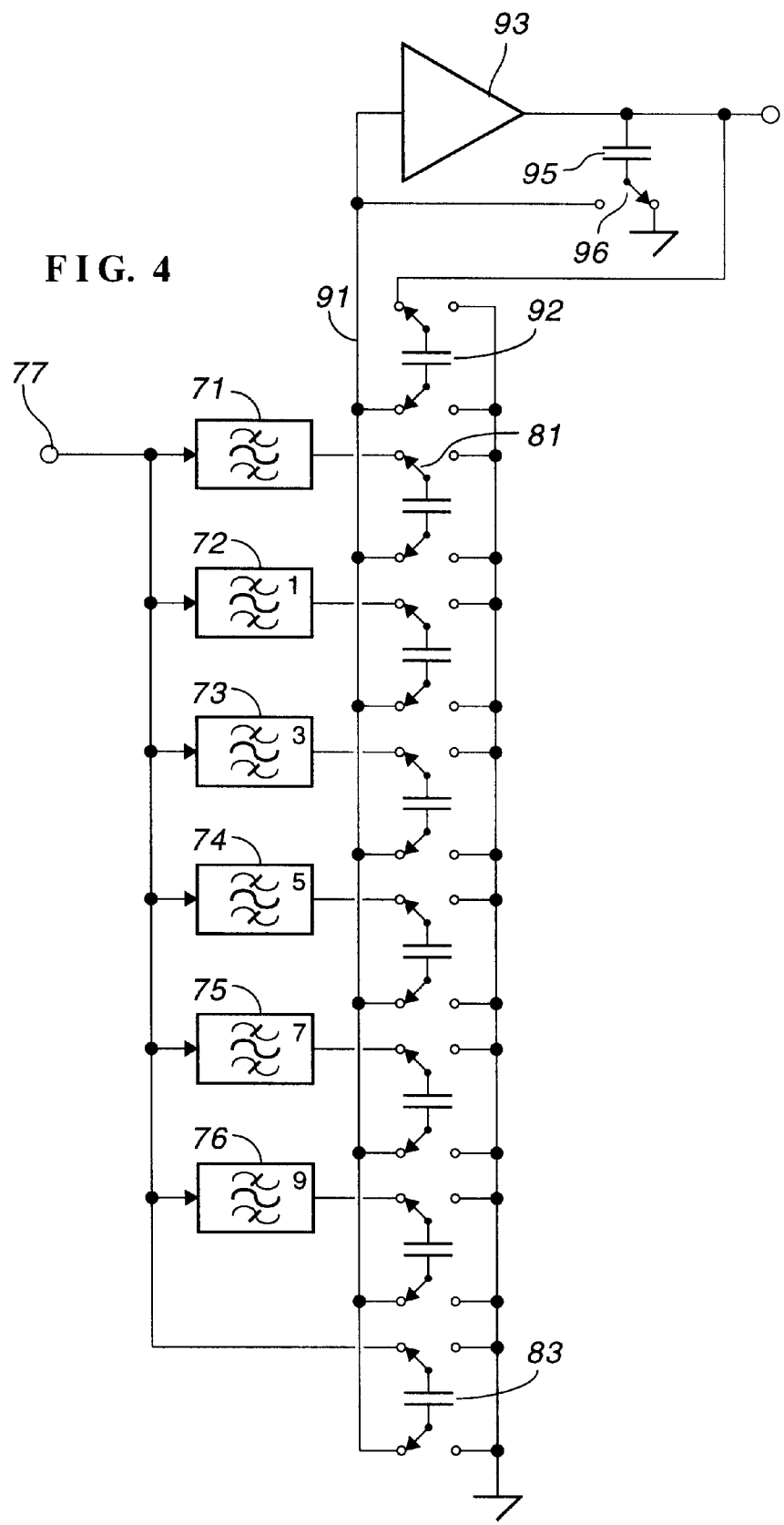
FIG. 4 is a schematic of a notch filter constructed in accordance with a preferred embodiment of the invention.

FIG. 4 illustrates a notch filter constructed in accordance with a preferred embodiment of the invention. Actually, FIG. 4 illustrates half of the notch filter because differential voltages are used in the preferred embodiment of the invention. Differential voltages eliminate errors due to drift and offset. The halves of the circuit are identical, the signals in one half are the opposite polarity of the signals in the other half.

Band pass filters 71, 72, 73, 74, 75, and 76 are each coupled to input 77. Band pass filter 71 is an extra filter having a center frequency (318/1.3=245 Hz) below the lowest frequency band to reduce edge effect. The filter has a lower Q than the others; e.g. a Q of 3 whereas the remaining filters have a Q of 8 in one embodiment of the invention.

The outputs of the filters are coupled to a sampling circuit including a plurality of capacitors and single pole, double throw sampling switches for sampling the output voltage of each amplifier and coupling that sample to a summation node. The sampling switches, such as switch 81, are shown in the sampling position.

Capacitor 83 appears to be an extra capacitor. This capacitor provides the direct signal, as described above in connection with FIG. 3, thereby creating a notch filter. The circuit of FIG. 4 eliminates the need for a summing amplifier for each band pass filter. The band pass filters include inverting amplifiers to provide signals of the correct polarity for subtraction at a summation node.

One terminal of each sampling capacitor is coupled to line 91. The currents from the sampling capacitors flow through capacitor 92, essentially to ground through the low output impedance of amplifier 93, thereby additively combining in capacitor 92. The voltage produced on the lower terminal of capacitor 92 is coupled to the input of amplifier 93, which has unity gain. The output voltage from amplifier 93 is stored on capacitor 95.

The switches change state at substantially the same time, which couples all the sampling capacitors and storage capacitor 92 to common, discharging the capacitors. At the same time, switch 96 couples one side of capacitor 95 to the input of amplifier 93, thereby maintaining the output of the amplifier relatively constant while the sampling capacitors discharge.

When the switches are returned to their previous state, a new set of samples is taken and the currents combine in capacitor 92. In one embodiment of the invention, the switches operated at a frequency of 44.1 kHz with substantially a fifty percent duty cycle; i.e. the switches are open very briefly between poles. Thus, the circuit of FIG. 4 combines creating a notch filter with the summation function in a circuit that is particularly suited to implementation as an integrated circuit.

The invention thus provides a noise reducing circuit that retains the advantages of a complementary comb filter with less signal degradation. The phase distortion caused by the notch filters is substantially located in the notch, thereby minimizing distortion.

Having thus described the invention, it will be apparent to those of skill in the art that many modifications can be made with the scope of the invention. For example, the preferred form of band pass filter is a switched capacitor filter; see pages 17.1–17.17 of the Williams and Taylor text. A switched capacitor filter is also well suited to being implemented in integrated circuit form. The invention can be implemented using any desired band pass filter. Although described in conjunction with a telephone, the invention can be used anywhere a comb filter is used.

What is claimed as the invention is:

1. In an audio processing circuit utilizing a complementary comb filter including a plurality of band pass filters, the improvement comprising:
    a plurality of notch filters having the same center frequencies as the band pass filters.

2. The audio processing circuit as set forth in claim 1 wherein said plurality of notch filters includes:
    a second plurality of band pass filters having the same center frequencies as the band pass filters, each filter of said second plurality having an input and an output, wherein said inputs are connected in parallel;
    a plurality plus one of sample and hold circuits, wherein the sample and hold circuits are coupled one each to said outputs and the remaining sample and hold circuit is coupled to said inputs connected in parallel;
    a storage capacitor coupled to said plurality plus one sample and hold circuit and an output capacitor;
    an amplifier having a feedback path alternately including said storage capacitor and said output capacitor.

3. The audio processing circuit as set forth in claim 2 wherein said amplifier has an output and wherein one side of said storage capacitor is coupled to the output of said amplifier and the other side of said storage capacitor is alternately connected to said sample and hold circuits and to common;
    whereby the output from said amplifier is substantially continuous.

4. The audio processing circuit as set forth in claim 1 wherein said notch filters each include:
    a band pass filter having an input and an output;
    an amplifier coupled to the input and the output of said band pass filter.

5. The audio processing circuit as set forth in claim 4 wherein said band pass filter inverts the signal at said output and wherein said amplifier has a single input coupled to said output and to said input of said band pass filter.

6. In an audio processing circuit utilizing a complementary comb filter including a plurality of band pass filters, the improvement comprising:
    a plurality of notch filters having the same center frequencies as dead bands defined by the band pass filters.

7. The audio processing circuit as set forth in claim 6 wherein said notch filters each include:
    a band pass filter having an input and an output;
    an amplifier coupled to the input and the output of said band pass filter.

8. The audio processing circuit as set forth in claim 7 wherein said band pass filter inverts the signal at said output and wherein said amplifier has a single input coupled to said output and to said input of said band pass filter.

9. A method for processing an audio signal, said method comprising the steps of:
    dividing the signal into a plurality of bands;
    passing the signal from each band through a pair of notch filters having the combined frequency response of a band pass filter.

10. The method as set forth in claim 9 wherein the center frequency of each band is determined by $$f_k = 318 \times 1.3^k$$

where k is an odd integer.

11. In a speaker phone having a speaker and a microphone coupled to a complementary comb filter that includes a plurality of band pass filters for minimizing coupling between said speaker and said microphone, the improvement comprising:
    a plurality of notch filters having the same center frequencies as the band pass filters.

12. The speaker phone as set forth in claim 11 wherein said notch filters each include:
    a band pass filter having an input and an output;
    an amplifier coupled to the input and the output of said band pass filter.

13. The speaker phone as set forth in claim 12 wherein said band pass filter inverts the signal at said output and wherein said amplifier has a single input coupled to said output and to said input of said band pass filter.

14. The speaker phone as set forth in claim 11 wherein the center frequency of the filters is determined by $$f_k = 318 \times 1.3_k$$

where k is an odd integer.

* * * * *